United States Patent
Wang

(10) Patent No.: US 8,836,364 B2
(45) Date of Patent: Sep. 16, 2014

(54) VOLTAGE TEST DEVICES USED IN LCD PANELS AND A SYSTEM THEREOF

(75) Inventor: Jin-jie Wang, Shenzhen (CN)

(73) Assignee: Shenzhen China Star Optoelectronics Technology Co., Ltd, Guangdong (CN)

( * ) Notice: Subject to any disclaimer, the term of this patent is extended or adjusted under 35 U.S.C. 154(b) by 240 days.

(21) Appl. No.: 13/318,349

(22) PCT Filed: Aug. 12, 2011

(86) PCT No.: PCT/CN2011/078314
§ 371 (c)(1),
(2), (4) Date: Oct. 31, 2011

(87) PCT Pub. No.: WO2013/013428
PCT Pub. Date: Jan. 31, 2013

(65) Prior Publication Data
US 2013/0027074 A1  Jan. 31, 2013

(30) Foreign Application Priority Data

Jul. 26, 2011  (CN) .......................... 2011 1 0210956

(51) Int. Cl.
*G01R 31/26*  (2014.01)
*G09G 3/00*  (2006.01)
*G01R 1/36*  (2006.01)
*G01R 31/28*  (2006.01)

(52) U.S. Cl.
CPC *G09G 3/006* (2013.01); *G01R 1/36* (2013.01); *G01R 31/2808* (2013.01)

USPC ................ 324/760.01; 324/760.02; 345/545; 345/691

(58) Field of Classification Search
USPC ................ 324/760.01, 760.02; 349/40, 49; 361/56, 58, 91; 345/545, 691
See application file for complete search history.

(56) References Cited

U.S. PATENT DOCUMENTS

| | | | | |
|---|---|---|---|---|
| 5,657,139 A | * | 8/1997 | Hayashi | 349/40 |
| 5,973,658 A | * | 10/1999 | Kim et al. | 345/92 |
| 6,040,733 A | * | 3/2000 | Casper et al. | 327/525 |
| 6,175,394 B1 | * | 1/2001 | Wu et al. | 349/40 |
| 6,839,097 B2 | * | 1/2005 | Park et al. | 349/40 |
| 2010/0157493 A1 | * | 6/2010 | Guedon et al. | 361/56 |

* cited by examiner

*Primary Examiner* — Arleen M Vazquez
*Assistant Examiner* — Neel Shah

(57) ABSTRACT

A voltage test device used in liquid crystal display (LCD) panels, including test solder pads and test lines, is proposed. The test solder pads are connected to an LCD panel through the test lines. Each of the test lines includes a switch test line and a signal-inputting test line. The voltage test device further includes a first connector. The switch test line includes a first portion of the switch test line and a second portion of the switch test line. The first portion of the switch test line is connected to the second portion of the switch test line through the first connector. The first connector is used for preventing the electric current in excess of a predetermined threshold from flowing inside the LCD panel. Meanwhile, a voltage testing system used in LCD panels is proposed.

5 Claims, 4 Drawing Sheets

VOLTAGE TEST DEVICES USED IN LCD PANELS AND A SYSTEM THEREOF

BACKGROUND OF THE INVENTION

1. Field of the Invention

The present invention relates to a liquid crystal display (LCD) devices, and more particularly, to a test device used in liquid crystal display (LCD) panels and an associated system.

2. Description of the Prior Art

Two principal methods of discharge—air discharge and contact discharge—are applied to thin film transistor-liquid crystal display (TFT-LCD) panels on which reliability testing is conducted. Referring to FIG. 1, electro-static discharge (ESD) testing at a voltage range of 0 to 4 KV is conducted on test points 1 to 8.

In an actual application, test points 3 to 8 can pass the ESD testing successfully while test points 1 and 2 cannot. When the amount of voltage is excessive during the ESD testing is conducted on test points 1 and 2, horizontal or vertical bright lines will occur easily. Analysis reveals that switching circuits under a driver chip 11 of the LCD panel (referring to FIG. 1B) is damaged, which leads to irregular transmissions of signals.

Referring to FIG. 1B, FIG. 1B shows an internal structure diagram in FIG. 1A. A test solder pad 12 is disposed near test points 1 and 2 (referring to FIG. 1A). When the ESD testing is conducted on test points 1 and 2, electric current flows inside the LCD panel through a test line 13 connected to the test solder pad 12. The electric current flowing inside the LCD panel causes damage to the circuits inside the LCD panel, which is the primary reason why the switching circuits are damaged.

In sum, an excessive amount of electric current occurring during the voltage testing is conducted on LCD panels usually causes damage to the circuits inside the LCD panels in the conventional technology. This problem needs to be solved by LCD manufacturers.

SUMMARY OF THE INVENTION

An object of the present invention is to provide a voltage test device for testing an LCD panel for solving the problem occurring in the conventional technology; that it, an excessive amount of electric current occurring during the voltage testing is conducted on the LCD panel usually causes damage to the switching circuits inside the LCD panel.

According to the present invention, a voltage test device used in liquid crystal display (LCD) panels, comprising test solder pads connected to an LCD panel through the test lines, and test lines comprising a switch test line and a signal-inputting test line, the voltage test device further comprises a first connector, the switch test line comprises a first portion and a second portion connected to the first portion through the first connector, and the first connector is used for preventing the electric current in excess of a predetermined threshold from flowing inside the LCD panel;

the signal-inputting test line comprises a first portion and a second portion;

the voltage test device comprises a second connector, and the first portion of the signal-inputting test line is connected to the second portion of the signal-inputting test line through the second connector;

when the amount of electric current flowing through the switch test line exceeds a predetermined threshold, the connection between the first portion of the switch test line and the second portion of the switch test line is cut due to a burnout of the first connector, so that the amount of electric current flowing inside the LCD panel is restricted;

when the amount of electric current flowing through the signal-inputting test line exceeds a predetermined threshold, the connection between the first portion of the signal-inputting test line and the second portion of the signal-inputting test line is cut due to a burnout of the second connector.

In one aspect of the present invention, the second connector comprises a second fastening component and a second conductor connected to the signal-inputting test line through the second fastening component. The second conductor has a higher resistance than the signal-inputting test line.

In one aspect of the present invention, the first connector comprises at least two branch connectors connected in parallel with each other and disposed between the first portion of the switch test line and the second portion of the switch test line.

In one aspect of the present invention, a third connector and a first transistor is disposed on the switch test line;

a second transistor is disposed on the signal-inputting test line, and the voltage test device further comprises a fourth connector;

wherein a source of the first transistor is connected to the test solder pad corresponding to the switch test line through the third connector, and a drain of the first transistor is connected to a gate of the second transistor through the fourth connector;

a source of the second transistor is connected to the test solder pad corresponding to the signal-inputting test line, and a drain of the second transistor is connected to a source of a switch inside the LCD panel.

In one aspect of the present invention, the first connector, the third connector, and the fourth connector all comprise a fastening component and a conductor;

the conductor in each of the connectors is connected to a test line corresponding to each of the connectors through the fastening component in each of the connectors;

wherein the conductor in each of the connectors has a higher resistance than its corresponding test line.

Another object of the present invention is to provide a voltage test device for testing an LCD panel to solve the problem occurring in the conventional technology; that it, an excessive amount of electric current occurring during the voltage testing is conducted on the LCD panels usually causes damage to the switching circuits inside the LCD panels.

According to the present invention, a voltage test device for testing an LCD panel, comprising test solder pads connected to an LCD panel through the test lines, and test lines comprising a switch test line and a signal-inputting test line, the voltage test device further comprises a first connector, the switch test line comprises a first portion and a second portion, and the first portion of the switch test line is connected to the second portion of the switch test line through the first connector;

the first connector is used for preventing the electric current in excess of a predetermined threshold from flowing inside the LCD panel.

In one aspect of the present invention, when the amount of electric current flowing through the switch test line exceeds a predetermined threshold, the connection between the first portion of the switch test line and the second portion of the switch test line is cut due to a burnout of the first connector, so that the amount of electric current flowing inside the LCD panel is restricted.

In one aspect of the present invention, the signal-inputting test line comprises a first portion and a second portion;

the voltage test device comprises a second connector, and the first portion of the signal-inputting test line is connected to the second portion of the signal-inputting test line through the second connector.

In one aspect of the present invention, when the amount of electric current flowing through the signal-inputting test line exceeds a predetermined threshold, the connection between the first portion of the signal-inputting test line and the second portion of the signal-inputting test line is cut due to a burnout of the second connector.

In one aspect of the present invention, the second connector comprises a second fastening component and a second conductor connected to the signal-inputting test line through the second fastening component;

wherein the second conductor has a higher resistance than the signal-inputting test line.

In one aspect of the present invention, the first connector comprises at least two branch connectors connected in parallel with each other and disposed between the first portion of the switch test line and the second portion of the switch test line.

In one aspect of the present invention, a third connector and a first transistor is disposed on the switch test line;

a second transistor is disposed on the signal-inputting test line, and the voltage test device further comprises a fourth connector;

wherein a source of the first transistor is connected to the test solder pad corresponding to the switch test line through the third connector, and a drain of the first transistor is connected to a gate of the second transistor through the fourth connector;

a source of the second transistor is connected to the test solder pad corresponding to the signal-inputting test line, and a drain of the second transistor is connected to a source of a switch inside the LCD panel.

In one aspect of the present invention, the first connector, the third connector, and the fourth connector all comprise a fastening component and a conductor;

the conductor in each of the connectors is connected to a test line corresponding to each of the connectors through the fastening component in each of the connectors;

wherein the conductor in each of the connectors has a higher resistance than its corresponding test line.

Another object of the present invention is to provide a voltage test system for testing an LCD panel for solving the problem occurring in the conventional technology; that it, an excessive amount of electric current occurring during the voltage testing is conducted on the LCD panel usually causes damage to the switching circuits inside the LCD panel.

According to the present, a voltage test system for testing an LCD panel comprises a voltage test device. The device comprises test solder pads connected to an LCD panel through the test lines, and test lines comprising a switch test line and a signal-inputting test line, the voltage test device further comprises a first connector, the switch test line comprises a first portion and a second portion, and the first portion of the switch test line is connected to the second portion of the switch test line through the first connector;

the first connector is used for preventing the electric current in excess of a predetermined threshold from flowing inside the LCD panel.

In one aspect of the present invention, when the amount of electric current flowing through the switch test line exceeds a predetermined threshold, the connection between the first portion of the switch test line and the second portion of the switch test line is cut due to a burnout of the first connector, so that the amount of electric current flowing inside the LCD panel is restricted.

In one aspect of the present invention, the signal-inputting test line comprises a first portion and a second portion;

the voltage test device comprises a second connector, and the first portion of the signal-inputting test line is connected to the second portion of the signal-inputting test line through the second connector.

In one aspect of the present invention, when the amount of electric current flowing through the signal-inputting test line exceeds a predetermined threshold, the connection between the first portion of the signal-inputting test line and the second portion of the signal-inputting test line is cut due to a burnout of the second connector.

In one aspect of the present invention, the second connector comprises a second fastening component and a second conductor connected to the signal-inputting test line through the second fastening component;

wherein the second conductor has a higher resistance than the signal-inputting test line.

In one aspect of the present invention, the first connector comprises at least two branch connectors connected in parallel with each other and disposed between the first portion of the switch test line and the second portion of the switch test line.

In one aspect of the present invention, a third connector and a first transistor is disposed on the switch test line;

a second transistor is disposed on the signal-inputting test line, and the voltage test device further comprises a fourth connector;

wherein a source of the first transistor is connected to the test solder pad corresponding to the switch test line through the third connector, and a drain of the first transistor is connected to a gate of the second transistor through the fourth connector;

a source of the second transistor is connected to the test solder pad corresponding to the signal-inputting test line, and a drain of the second transistor is connected to a source of a switch inside the LCD panel.

In contrast to the prior art, the voltage test device for testing an LCD panel provided by the present invention comprises test solder pads and test lines. The test solder pads are connected to an LCD panels through the test lines. The test lines comprise a switch test line and a signal-inputting test line. The voltage test device further comprises a first connector. The switch test line comprises a first portion of the switch test line and a second portion of the switch test line. The first portion of the switch test line is connected to the second portion of the switch test line through the first connector. The first connector is used for restricting the amount of electric current flowing inside the LCD panel on the basis of the current strength, preventing the circuits inside the LCD panel from being damaged by an excessive amount of electric current. In other words, the circuits inside the LCD panel is protected from being damaged during the voltage testing is conducted on the LCD panel, which effectively increasing testing efficiency.

These and other features, aspects and advantages of the present disclosure will become understood with reference to the following description, appended claims and accompanying figures.

DETAILED DESCRIPTION OF THE PREFERRED EMBODIMENTS

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

Figure 1A:
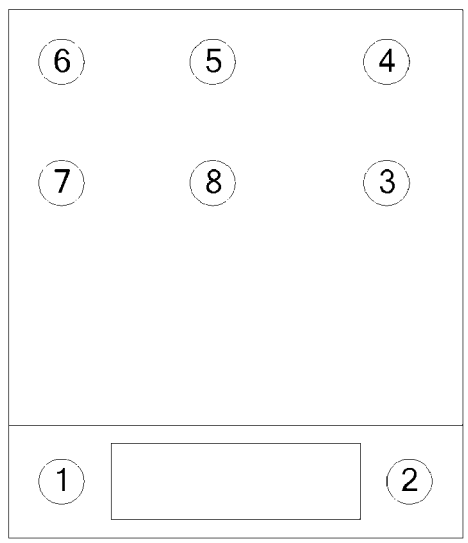
FIGS. 1A-1B depicts a voltage test for an LCD panel by using conventional technology.
Figure 1B:
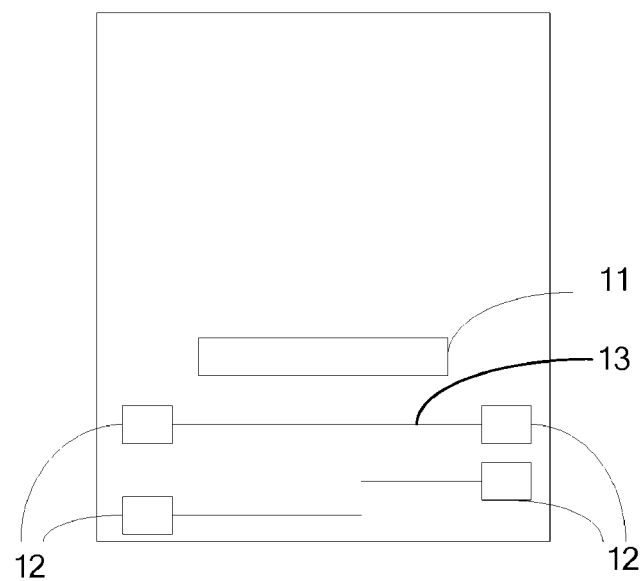
Figure 2:
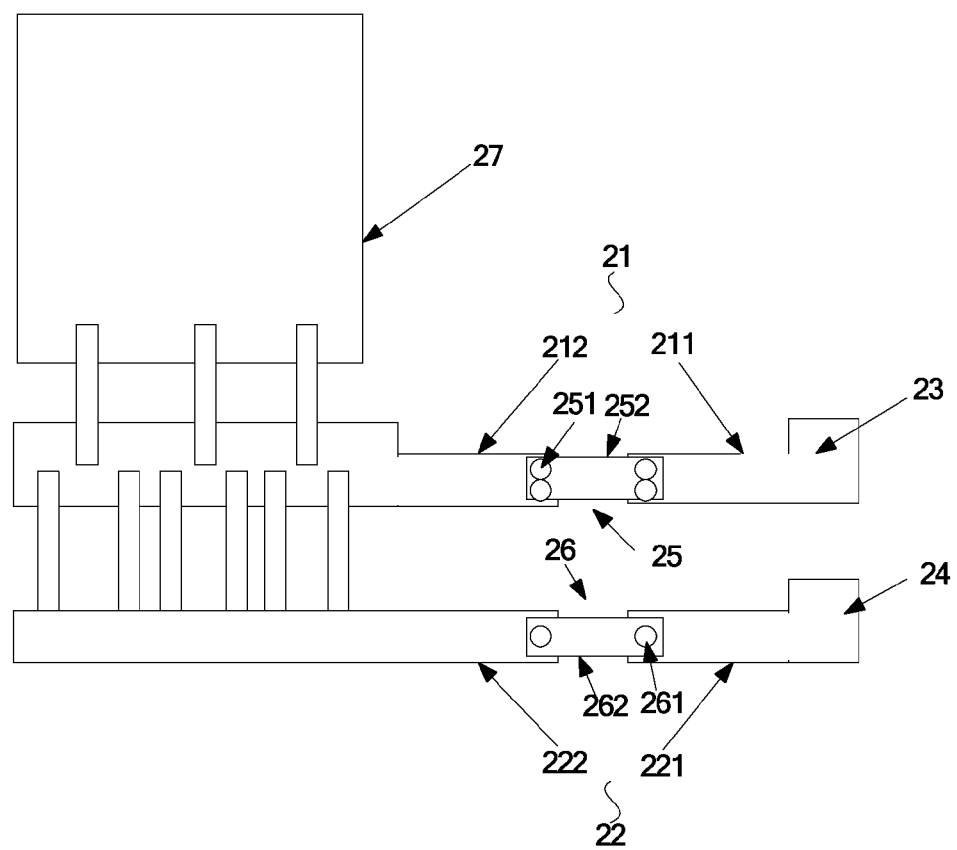
FIG. 2 shows a structure diagram of a voltage test device for testing an LCD panel according to a first preferred embodiment of the present invention.

FIG. 2 shows a structure diagram of a voltage test device for testing an LCD panel according to a first preferred embodiment of the present invention.

According to the first embodiment, the voltage test device comprises a switch test line 21 and a signal-inputting test line 22. The first test solder pad 23 corresponds to the switch test line 21, and the second test solder pad 24 corresponds to the signal-inputting test line 22. The voltage test device further comprises a first connector 25 and a second connector 26.

The switch test line 21 comprises a first portion 211 and a second portion 212. The first portion 211 is connected to the second portion 212 through the first connector 25.

According to the first embodiment as shown in FIG. 2, the signal-inputting test line 22 comprises a first portion of the signal-inputting test line 221 and a second portion of the signal-inputting test line 222. The first portion of the signal-inputting test line 221 is connected to the second portion of the signal-inputting test line 222 through the second connector 26.

Continuing to refer to FIG. 2, the first connector 25 comprises a first fastening component 251 and a first conductor 252. The first conductor 252 is connected to the switch test line 21 through the first fastening component 251. The first fastening component 251 and the first conductor 252 both have a higher resistance than the switch test line 21.

Continuing to refer to FIG. 2, the second connector 26 comprises a second fastening component 261 and a second conductor 262. The second conductor 262 is connected to signal-inputting test line 22 through the second fastening component 261. The second fastening component 261 and the second conductor 262 both have a higher resistance than the signal-inputting test line 22.

Preferably, the first and second conductors 252 and 262 are made of indium tin oxide (ITO); otherwise, the conductors 252 and 262 are made from conductive materials having a higher resistance (e.g., metallic materials) as long as the first conductor 252 has a higher resistance than the switch test line 21, and the second conductor 262 has a higher resistance than the signal-inputting test line 22. The first and second fastening components 251 and 261 may be made of metallic materials having a higher resistance.

The operating principle of the first preferred embodiment as shown in FIG. 2 is as follows:

Voltage testing starts to be conducted on an LCD panel 27. Firstly, high voltage is applied on the first test solder pad 23 for turning on a switch (not shown) inside the LCD panel 27. Subsequently, a test signal applied on the first test solder pad 23 is input inside the LCD panel 27 through the switch test line 21, and a test signal applied on the second test solder pad 24 is input inside the LCD panel 27 through the signal-inputting test line 22.

The amount of electric current flowing through the switch test line 21 and the signal-inputting test line 22 may exceed a predetermined threshold, e.g., 10A. When such a situation occurs, heat generated by the excessive amount of electric current causes the first conductor 252 and the second conductor 262 to be burnt out because the first conductor 252 has a higher resistance than the switch test line 21 and the second conductor 262 has a higher resistance than the signal-inputting test line 22. Accordingly, a disconnection of the switch test line 21 to the signal-inputting test line 22 prevents the excessive amount of electric current from flowing inside the LCD panel 27. In other words, the circuits inside the LCD panel 27 are protected.

Obviously, the circuits inside the LCD panel 27 can be prevented from being damaged by an excessive amount of electric current during the voltage testing is conducted on the LCD panel 27 according to the first embodiment as shown in FIG. 2.

Figure 3:
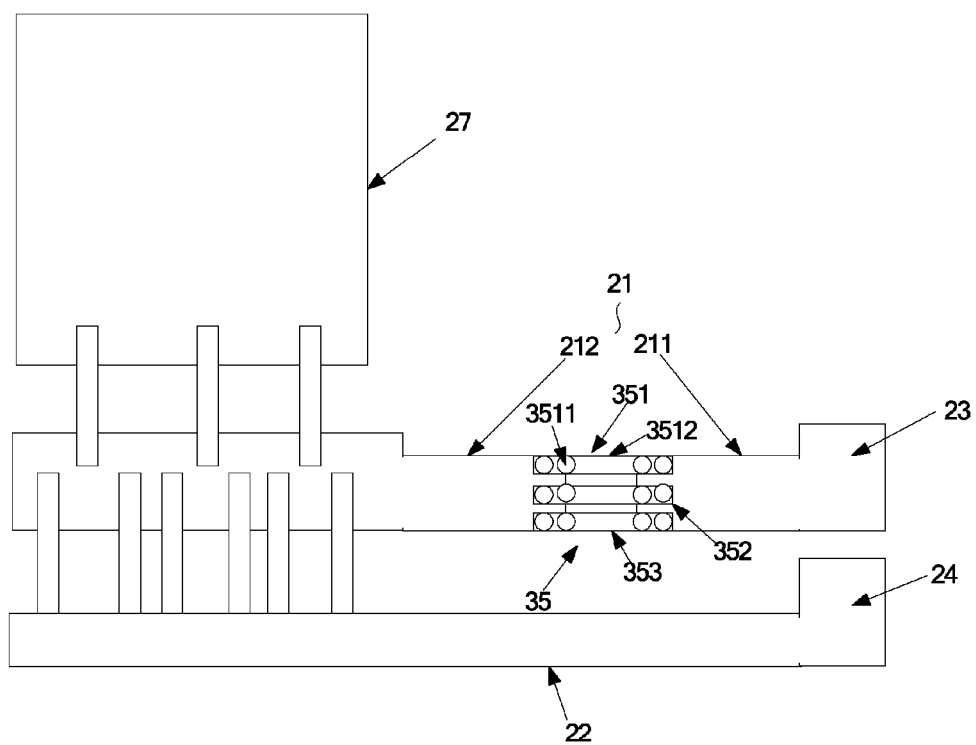
FIG. 3 shows a structure diagram of a voltage test device for testing an LCD panel according to a second preferred embodiment of the present invention.

FIG. 3 shows a structure diagram of the voltage test device for testing an LCD panel according to a second preferred embodiment of the present invention.

Differing from the first preferred embodiment, a first connector 35 comprises at least two branch connectors in the second preferred embodiment. Three branch connectors shown in FIG. 3 are a top connector 351, a medial connector 352, and a bottom connector 353 from top to bottom. The three connectors 351, 352, and 353 are connected in parallel and are disposed between the first portion 211 of the switch test line 21 and the second portion 212 of the switch test line 21. Since the three connectors 351, 352, and 353 are connected in parallel, the width of the first connector 35 is far smaller than that of the switch test line 21. In this way, the first connector 35 has a lower resistance than the switch test line 21 even though the first connector 35 and the switch test line 21 both are made of the same materials.

In an actual application, it is possible that two branch connectors (for example, the top connector 351 connected to the medial connector 352) or a plurality of branch connectors are connected in parallel as long as the width of the first connector 35 is smaller than that of the switch test line 21.

Referring to FIG. 3, the top connector 351, the medial connector 352, and the bottom connector 353 all comprise a fastening component and a conductor (not shown). Take the top connector 351 for example. The top connector 351 comprises a top fastening component 3511 and a top conductor 3512. The top conductor 3512 is connected to the switch test line 21 through the top fastening component 3511. The top fastening component 3511 and the top conductor 3512 both have a higher resistance than the switch test line 21.

Preferably, the conductor in each of the top connector 351, the medial connector 352, and the bottom connector 353 is made of ITO; otherwise the conductor is made from conductive materials having a higher resistance (such as metallic materials) as long as the conductor in each of the connectors 351, 352, and 353 has a higher resistance than the switch test line 21. The fastening component in each of the connectors 351, 352, and 353 is made of metallic materials having a higher resistance.

The operating principle of the second preferred embodiment as shown in FIG. 3 is as follows:

The voltage testing starts to be conducted on the LCD panel 27. Firstly, high voltage is applied on the first test solder pad 23 for turning on the switch (not shown) inside the LCD panel 27. Subsequently, a test signal applied on the first test solder pad 23 is input inside the LCD panel 27 through the switch test line 21, and a test signal applied on the second test solder pad 24 is input inside the LCD panel 27 through the signal-inputting test line 22.

The amount of electric current flowing through the switch test line 21 may exceed a predetermined threshold, e.g., 10A. However, the first connector 35 on the switch test line 21 has a far higher resistance than the switch test line 21 because the three connectors 351, 352, and 353 in the first connector 35 are connected in parallel. Such a design successfully prevents an excessive amount of electric current from flowing inside the LCD panel 27. In other words, the circuits inside the LCD panel 27 are effectively protected.

Figure 4:
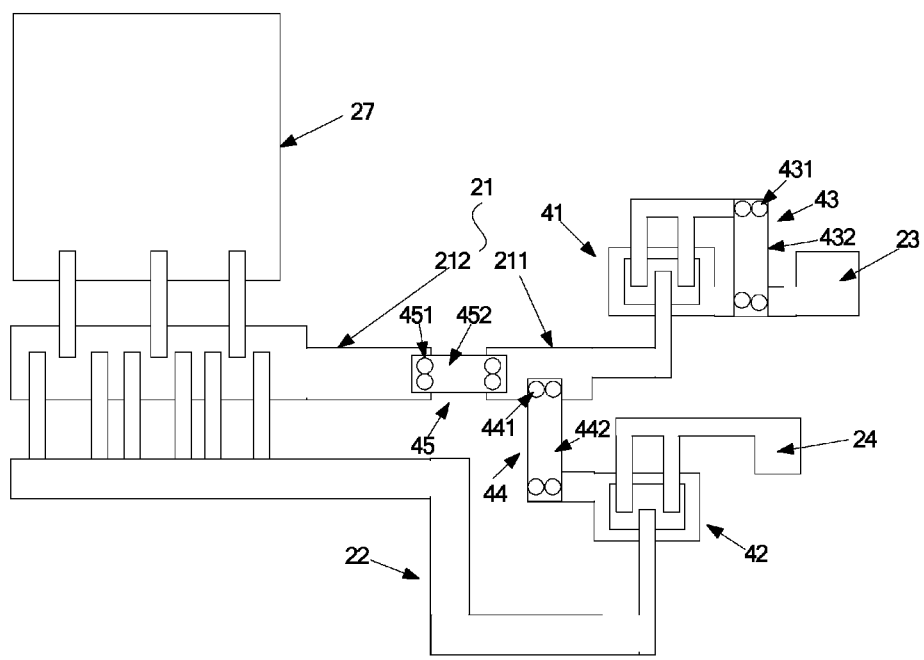
FIG. 4 shows a structure diagram of a voltage test device for testing an LCD panel according to a third preferred embodiment of the present invention.

FIG. 4 shows a structure diagram of the voltage test device for testing an LCD panel according to a third preferred embodiment of the present invention.

The difference between the first and second preferred embodiments and the third preferred embodiment is that, in the voltage test device as shown in FIG. 4, the switch test line 21 comprises a first transistor 41 and a third connector 43 in addition a first connector 45; the signal-inputting test line 22 comprises a second transistor 42; the voltage test device further comprises a fourth connector 44.

Referring to FIG. 4, FIG. 4 shows that the first transistor 41 and the third connector 43 are disposed on the first portion 211 of the switch test line 21. The source of the first transistor 41 is connected to the first test solder pad 23 through the third connector 43, and the drain of the first transistor 41 is connected to the gate of the second transistor 42 through the fourth connector 44.

The third connector 43 comprises a third fastening component 431 and a third conductor 432, and the source of the first transistor 41 is connected to the first test solder pad 23 through the third conductor 432. The third fastening component 431 and the third conductor 432 both have a higher resistance than the switch test line 21.

The source of the second transistor 42 is connected to the second test solder pad 24, and the drain of the second transistor 42 is connected to the source of the switch inside the LCD panel 27.

The fourth connector 44 comprises a fourth fastening component 441 and a fourth conductor 442. The drain of the first transistor 41 is connected to the gate of the second transistor 42 through the fourth conductor 442.

The first connector 45 comprises a first fastening component 451 and a first conductor 452. The first fastening component 451 and the first conductor 452 both have a higher resistance than the switch test line 21.

The operating principle of the third preferred embodiment as shown in FIG. 4 is as follows:

Voltage testing starts to be conducted on the LCD panel 27. Firstly, high voltage is applied on the first test solder pad 23 for turning on the first transistor 41. After passing through the drain of the first transistor, the high voltage turns on the second transistor and the switch inside the LCD panel 27 at the same time. Subsequently, a test signal representing the first test solder pad 23 is input inside the LCD panel 27 through the switch test line 21, and a test signal representing the second test solder pad 24 is input inside the LCD panel 27 through the signal-inputting test line 22. The voltage testing conducted on the LCD panel 27 is finished.

When the amount of electric current flowing through the switch test line 21 exceeds a predetermined threshold (for example, 10A), two measures are used to restrict the amount of electric current flowing inside the LCD panel 27 according to the third preferred embodiment as shown in FIG. 4. The two measures are as follows:

Firstly, heat generated by the excessive amount of electric current causes the first conductor 452 in the first connector 45 to be burnt out, thereby causing the switch test line 21 to be disconnected. So the excessive amount of electric current is prevented from flowing inside the LCD panel 27. In other words, the circuits inside the LCD panel 27 are protected.

Secondly, the third conductor 432 in the third connector 43 has a higher resistance than the switch test line 21. The source of the first transistor 41 is connected to the first test solder pad 23 through the third conductor 432. Since the suddenly generated heat causes the third conductor 432 to be burnt out, the third conductor 432 cannot serve as a conducting channel for signals output by the source of the first transistor 41 to pass through. In other words, the first transistor 41 cannot perform its function. The second transistor 42 will be turned on after high voltage provided by the first transistor 41 is applied on it. The malfunction of the first transistor 41 leads to the malfunction of the second transistor 42 as well. Thus, the excessive amount of electric current cannot flow inside the LCD panel 27, protecting the circuits inside the LCD panel 27 effectively.

The present invention further provides a voltage testing system used in LCD panels. The system comprises an LCD panel and a voltage test device for testing an LCD panel provided by the present invention. Information about the voltage test device has been fully revealed, so no further details are released hereafter.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A voltage test device for testing an LCD panel, comprising test solder pads connected to an LCD panel through the test lines, and test lines comprising a switch test line and a signal-inputting test line, characterized in that:

the voltage test device further comprises a first connector, the switch test line comprises a first portion and a second portion, and the first portion of the switch test line is connected to the second portion of the switch test line through the first connector;

the first connector is used for preventing the electric current in excess of a predetermined threshold from flowing inside the LCD panel;

a third connector and a first transistor is disposed on the switch test line;

a second transistor is disposed on the signal-inputting test line, and the voltage test device further comprises a fourth connector;

wherein a source of the first transistor is connected to the test solder pad corresponding to the switch test line through the third connector, and a drain of the first transistor is connected to a gate of the second transistor through the fourth connector;

a source of the second transistor is connected to the test solder pad corresponding to the signal-inputting test line, and a drain of the second transistor is connected to a source of a switch inside the LCD panel.

2. The voltage test device for testing an LCD panel of claim 1, characterized in that:

when the amount of electric current flowing through the switch test line exceeds a predetermined threshold, the connection between the first portion of the switch test line and the second portion of the switch test line is cut due to a burnout of the first connector, so that the amount of electric current flowing inside the LCD panel is restricted.

3. The voltage test device for testing an LCD panel of claim 1, characterized in that: the first connector, the third connector, and the fourth connector all comprise a fastening component and a conductor;
the conductor in each of the connectors is connected to a test line corresponding to each of the connectors through the fastening component in each of the connectors;
wherein the conductor in each of the connectors has a higher resistance than its corresponding test line.

4. A voltage test system for testing an LCD panel, characterized in that: the voltage test system comprises a voltage test device, the device comprises test solder pads connected to an LCD panel through the test lines, and test lines comprising a switch test line and a signal-inputting test line,
the voltage test device further comprises a first connector, the switch test line comprises a first portion and a second portion, and the first portion of the switch test line is connected to the second portion of the switch test line through the first connector;
the first connector is used for preventing the electric current in excess of a predetermined threshold from flowing inside the LCD panel;
a third connector and a first transistor is disposed on the switch test line;
a second transistor is disposed on the signal-inputting test line, and the voltage test device further comprises a fourth connector;
wherein a source of the first transistor is connected to the test solder pad corresponding to the switch test line through the third connector, and a drain of the first transistor is connected to a gate of the second transistor through the fourth connector;
a source of the second transistor is connected to the test solder pad corresponding to the signal-inputting test line, and a drain of the second transistor is connected to a source of a switch inside the LCD panel.

5. The voltage test system for testing an LCD panel of claim 4, characterized in that: when the amount of electric current flowing through the switch test line exceeds a predetermined threshold, the connection between the first portion of the switch test line and the second portion of the switch test line is cut due to a burnout of the first connector, so that the amount of electric current flowing inside the LCD panel is restricted.

* * * * *